(12) United States Patent
Zhang et al.

(10) Patent No.: US 8,924,823 B2
(45) Date of Patent: Dec. 30, 2014

(54) SYSTEM AND METHOD FOR CYCLE SLIP CORRECTION

(71) Applicant: Tyco Electronics Subsea Communications LLC, Eatontown, NJ (US)

(72) Inventors: Hongbin Zhang, Marlboro, NJ (US); Hussam G. Batshon, Eatontown, NJ (US)

(73) Assignee: Tyco Electronics Subsea Communications LLC, Eatontown, NJ (US)

( * ) Notice: Subject to any disclaimer, the term of this patent is extended or adjusted under 35 U.S.C. 154(b) by 112 days.

(21) Appl. No.: 13/833,667

(22) Filed: Mar. 15, 2013

(65) Prior Publication Data

US 2014/0281832 A1    Sep. 18, 2014

(51) Int. Cl.
*H03M 13/00* (2006.01)
*H04L 5/12* (2006.01)
*H04L 27/22* (2006.01)
*H04L 27/36* (2006.01)
*G06F 11/10* (2006.01)

(52) U.S. Cl.
CPC ...................................... *G06F 11/10* (2013.01)
USPC ............ 714/776; 375/261; 375/298; 329/304

(58) Field of Classification Search
USPC ................. 714/776, 774, 799, 800, 701, 756; 375/261, 298, 260, 268, 262, 265, 300, 375/320; 329/304; 332/103
See application file for complete search history.

(56) References Cited

U.S. PATENT DOCUMENTS

| | | | |
|---|---|---|---|
| 6,195,396 B1 | 2/2001 | Fang et al. | |
| 7,613,253 B2 * | 11/2009 | Weinholt | 375/320 |
| 7,778,341 B2 * | 8/2010 | Tong et al. | 375/265 |
| 8,295,713 B2 | 10/2012 | Cai | |
| 2014/0153672 A1 * | 6/2014 | Zhao et al. | 375/320 |

OTHER PUBLICATIONS

Jin-Xing Cai: "100G Transmission Over Transoceanic Distance with High Spectral Efficiency and Large Capacity", Journal of Lightwave Technology, IEEE Service Center, New York, NY, US, vol. 30, No. 24, Dec. 2012, pp. 3845-3856.
International Search Report issued in corresponding PCT application No. PCT/US2014/022401 on Jun. 23, 2014.

* cited by examiner

*Primary Examiner* — Christine Tu

(57) ABSTRACT

A system and method including a parity bit encoder for encoding each n bits of data to be transmitted with a parity check bit to produce blocks of n+1 bits (n information bits plus one parity bit associated with the n information bits). Each of the blocks of n+1 bits are Gray mapped to a plurality of associated QAM symbols that are modulated onto an optical wavelength and transmitted to a receiver. A maximum a posteriori (MAP) decoder is used at the receiver to correct for cycle slip. Phase errors of 180 degrees may be detected by independently encoding odd and even bits prior to Gray mapping, and identifying errors in decoding odd numbered bits at the receiver.

17 Claims, 6 Drawing Sheets

SYSTEM AND METHOD FOR CYCLE SLIP CORRECTION

TECHNICAL FIELD

The present disclosure relates to optical signal data detection and more particularly, to a system and method for correcting cycle slip in an optical communication system.

BACKGROUND

In wavelength division multiplexed (WDM) optical communication systems, a number of different optical carrier wavelengths are separately modulated with data to produce modulated optical signals. The modulated optical signals are combined into an aggregate signal and transmitted over an optical transmission path to a receiver. The receiver detects and demodulates the data.

One type of modulation that may be used in optical communication systems is phase shift keying (PSK). According to different variations of PSK, data is transmitted by modulating the phase of an optical wavelength such that the phase or phase transition of the optical wavelength represents symbols encoding one or more bits. In a binary phase-shift keying (BPSK) modulation scheme, for example, two phases may be used to represent 1 bit per symbol. In a quadrature phase-shift keying (QPSK) modulation scheme, four phases may be used to encode 2 bits per symbol. Other phase shift keying formats include differential phase shift keying (DPSK) formats and variations of PSK and DPSK formats, such as return-to-zero DPSK (RZ-DPSK) and polarization division multiplexed QPSK (PDM-QPSK).

A modulation format, such as QPSK wherein multiple information bits are be encoded on a single transmitted symbol may be generally referred to as a multi-level modulation format. Multi-level modulation techniques have been used, for example, to allow increased transmission rates and decreased channel spacing, thereby increasing the spectral efficiency (SE) of each channel in a WDM system. One spectrally efficient multi-level modulation format is quadrature amplitude modulation (QAM). In a QAM signal, information is modulated using a combination of phase shift keying and amplitude shift keying, for example, to encode multiple bits per symbol. A 16-QAM modulation format may be used, for example, to encode 4 bits per symbol. PSK modulation schemes (e.g., BPSK and QPSK) may be referred to as a level of QAM (e.g., 2QAM and 4QAM respectively).

In phase modulated optical communication systems using, for example, a QAM scheme, the receiver may be a coherent receiver using coherent detection, e.g. homodyne or heterodyne detection, to detect modulated optical signals. The term "coherent" when used herein in relation to a receiver refers to a receiver including a local oscillator (LO) for demodulating the received signal. Digital signal processing (DSP) may be implemented in such systems for processing the received signals to provide demodulated data. Digital signal processing of the received signal provides speed and flexibility, and may be used to perform a variety of functions including correction of nonlinearities associated with the optical transmission path such as chromatic dispersion, polarization mode dispersion, etc.

Coherent detection schemes for phase modulated systems may use absolute phase detection. Absolute phase detection may involve making a decision, e.g. a soft decision, regarding the value of each bit in the received data stream based on an estimated phase. Unfortunately, for $M^2$-QAM, e.g., QPSK and 16 QAM, the signal constellation is invariant under a phase rotation of angle $\pi/2$. The carrier phase estimator used to determine the estimated phase cannot distinguish between an angle $\theta$ and an angle $\theta+\pi/2$. As a result, the estimated carrier phase may be pushed away from the current stable operating point into the domain of attraction of a neighboring stable operating point, which effectively rotates the signal constellation by $\pi/2$. This phenomenon is referred to as cycle slip. The cycle slip can generate a large number of decision errors after the cycle slip event. The effect of cycle slip can be limited to the duration of actual slip by using differential decoding of the information symbols. However, the differential decoding can have about twice the bit error rate of the absolute phase detection.

One approach for correcting cycle slip is to introduce pilot symbols with known information symbols. The pilot symbols remove the phase ambiguity since the carrier phase of the pilot symbol can be unambiguously estimated by calculating the difference of the phase between the received pilot symbol and the known information symbols. However, the overhead of the pilot symbol causes a larger symbol rate resulting in a sensitivity penalty. To address this, pilot symbols may be inserted with a large period. In general, it may take about half the number of symbols between pilot symbols period before the cycle slip is detected and the carrier phase reference is corrected. The time it takes to make the correction can result in burst errors in the detected data.

BRIEF DESCRIPTION OF THE DRAWINGS

Reference should be made to the following detailed description which should be read in conjunction with the following figures, wherein like numerals represent like parts.

DETAILED DESCRIPTION

In general, a system consistent with the present disclosure encodes each n bits of data to be transmitted with a parity check bit to produce blocks of n+1 bits (n information bits plus one parity bit associated with the n information bits). Each of the blocks of n+1 bits are Gray mapped to a plurality of associated QAM symbols that are modulated onto an optical carrier and transmitted to a receiver. The receiver detects the symbols using a maximum a posteriori (MAP) and corrects for cycle slip.

In one embodiment, for example the symbols associated with each block of n+1 bits may be decoded by selecting the symbols having correct parity and the minimum Euclidean distance to the detected symbols. Since the detector uses correct parity in making symbol decisions an error signal in the detector increases with cycle slip to automatically detect and correct cycle slip and prevent the detector from converging on a 90 degree ($\pi/2$) phase error. Phase errors of 180 degrees may be detected in a system consistent with the present disclosure by independently encoding odd and even bits prior to Gray mapping, and detecting errors in decoding even bits at the receiver.

As used herein a "Gray map" or "Gray mapping" refers to the known Gray mapping scheme whereby a code is assigned to each of a contiguous set of bits such that adjacent code words differ by one bit and does not involve adding additional bits to a data stream (i.e. Gray mapping has no overhead). The term "coupled" as used herein refers to any connection, coupling, link or the like by which signals carried by one system element are imparted to the "coupled" element. Such "coupled" devices, or signals and devices, are not necessarily directly connected to one another and may be separated by intermediate components or devices that may manipulate or modify such signals.

Figure 1:
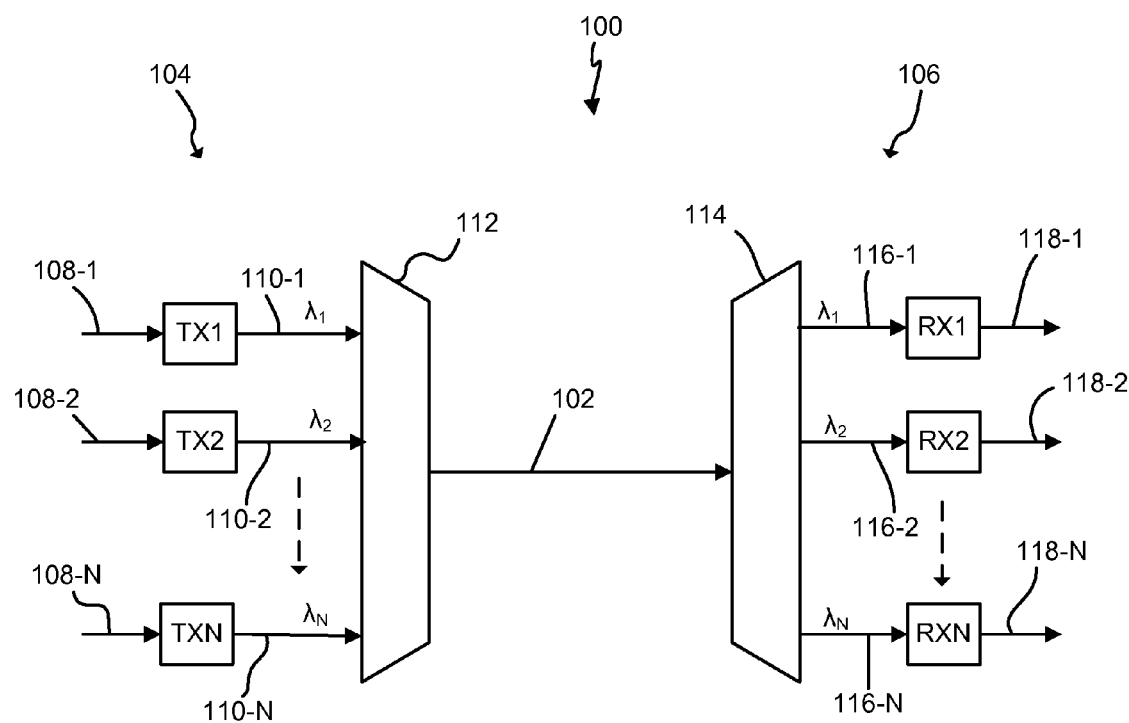
FIG. 1 is a block diagram of one exemplary embodiment of a system consistent with the present disclosure.

FIG. 1 is a simplified block diagram of one exemplary embodiment of a WDM transmission system 100 consistent with the present disclosure. The transmission system serves to transmit a plurality of optical channels over an optical information path 102 from a transmitting terminal 104 to one or more remotely located receiving terminals 106. The exemplary system 100 may be a long-haul submarine system configured for transmitting the channels from a transmitter to a receiver at a distance of 5,000 km, or more. Although exemplary embodiments are described in the context of an optical system and are useful in connection with a long-haul WDM optical system, the broad concepts discussed herein may be implemented in other communication systems transmitting and receiving other types of signals.

Those skilled in the art will recognize that the system 100 has been depicted as a highly simplified point-to-point system for ease of explanation. For example, the transmitting terminal 104 and receiving terminal 106 may, of course, both be configured as transceivers, whereby each may be configured to perform both transmitting and receiving functions. For ease of explanation, however, the terminals are depicted and described herein with respect to only a transmitting or receiving function. It is to be understood that a system and method consistent with the disclosure may be incorporated into a wide variety of network components and configurations. The illustrated exemplary embodiments herein are provided only by way of explanation, not of limitation.

In the illustrated exemplary embodiment, each of a plurality of transmitters TX1, TX2 . . . TXN receives a data signal on an associated input port 108-1, 108-2 . . . 108-N, and transmits the data signal on associated wavelength $\lambda_1, \lambda_2 \ldots \lambda_N$. One or more of the transmitters TX1, TX2 . . . TXN may be configured to modulate data on the associated wavelength with using a modified BICM-ID scheme consistent with the present disclosure. The transmitters, of course, are shown in highly simplified form for ease of explanation. Those skilled in the art will recognize that each transmitter may include electrical and optical components configured for transmitting the data signal at its associated wavelength with a desired amplitude and modulation.

The transmitted wavelengths or channels are respectively carried on a plurality of paths 110-1, 110-2 . . . 110-N. The data channels are combined into an aggregate signal on optical path 102 by a multiplexer or combiner 112. The optical information path 102 may include optical fiber waveguides, optical amplifiers, optical filters, dispersion compensating modules, and other active and passive components.

The aggregate signal may be received at one or more remote receiving terminals 106. A demultiplexer 114 separates the transmitted channels at wavelengths $\lambda_1, \lambda_2 \ldots \lambda_N$ onto associated paths 116-1, 116-2 . . . 116-N coupled to associated receivers RX1, RX2 . . . RXN. One or more of the receivers RX1, RX2 . . . RXN may be configured to demodulate the transmitted signal using iterative decoding associated with a modified BICM-ID scheme consistent with the present disclosure and may provide an associated output data signal on an associated output path 118-1, 118-2, 118-3, 118-N.

Figure 2:
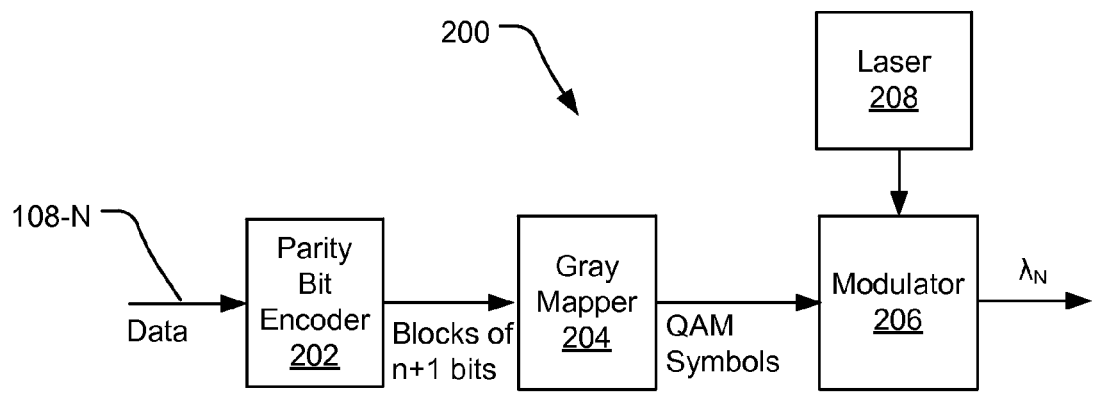
FIG. 2 is a block diagram of one exemplary embodiment of a transmitter consistent with the present disclosure.

FIG. 2 is a simplified block diagram of one exemplary transmitter 200 consistent with the present disclosure. The illustrated exemplary embodiment 200 includes a parity bit encoder 202, a Gray mapper 204, and a modulator 206 for modulating the output of a continuous-wave laser 208 for providing a coded and modulated output on a carrier wavelength $\lambda_N$.

The parity bit encoder 202 may be configured to encode each n information bits of a data stream provided on input path 118-N with an associated parity bit. The output of the parity bit encoder 202 includes successive blocks of n+1 bits, i.e. n information bits plus a parity bit. The parity bit added by the parity bit encoder 202 identifies, in a known manner, whether the number of bits with a value of one in the associated n information bits is even or odd.

As is known, a parity bit may be an even parity bit or an odd parity bit. When using even parity, the parity bit is set to a value of one if the number of ones in the n information bits (not including the parity bit) is odd, making the number of ones in the entire block of n+1 bits (the n information bits plus the parity bit) even. If the number of ones in the n information bits is already even, the even parity bit is set to a 0. When using odd parity, the parity bit is set to 1 if the number of ones in the n information bits (not including the parity bit) is even, keeping the number of ones in the entire block of n+1 bits (the n information bits plus the parity bit) odd. When the number of ones in the n information bits is already odd, the odd parity bit is set to 0. Hardware and software configurations for encoding each n bits of input data with an even or odd parity bit in the parity bit encoder 202 are known to those of ordinary skill in the art.

The encoded output of the parity bit encoder is coupled to the Gray mapper 204. The Gray mapper 204 is configured map each block of n+1 bits to an associated plurality of QAM symbols. The plurality of QAM symbols associated with each block of n+1 bits are modulated onto an optical carrier wavelength $\lambda_N$ of the continuous-wave laser 208 using the modulator 206. The modulator 206 may modulate the plurality of QAM symbols onto the carrier wavelength $\lambda_N$ using any known modulation method. The encoded, mapped and modulated output of the modulator 206 may be coupled to the multiplexer 112 (FIG. 1) in a WDM system.

Figure 3:
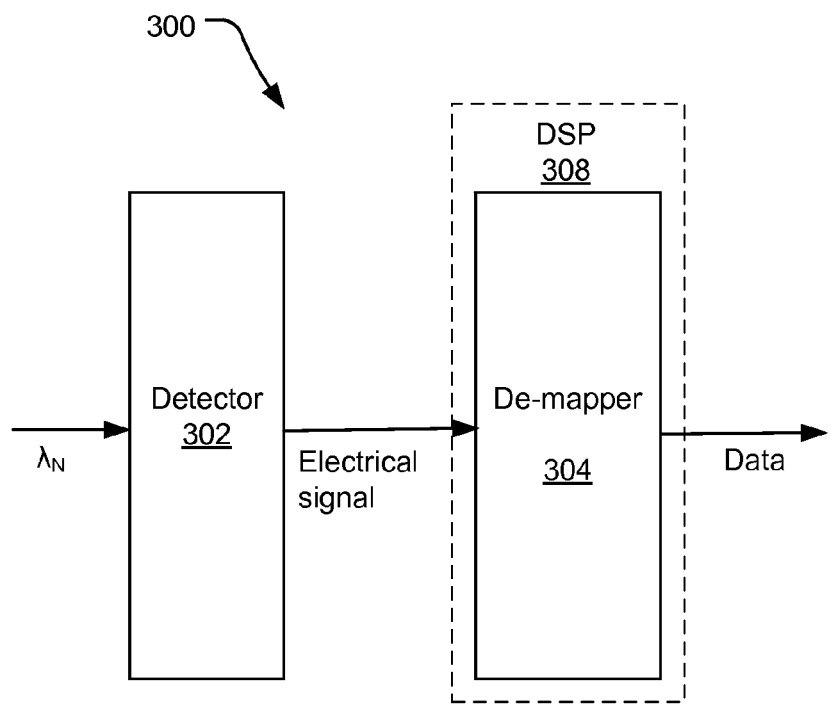
FIG. 3 is a block diagram of one exemplary embodiment of a receiver consistent with the present disclosure.

FIG. 3 is a simplified block diagram of one exemplary receiver 300 consistent with the present disclosure. The illustrated exemplary embodiment 300 includes an optical signal detector 302 and a de-mapper 304. The detector 302 may include a known coherent receiver, e.g. a polarization diversity coherent receiver, configured to receive the signal on the optical carrier wavelength $\lambda_N$ and convert the optical signal into one or more associated electrical outputs (e.g. an output associated with each polarization in a polarization multiplexed modulation format) representative of the QAM symbols modulated on the optical carrier wavelength $\lambda_N$ by the modulator 206 (FIG. 2).

The de-mapper 304 may be configured as a portion of a digital signal processing (DSP) circuit 308. In general, DSP involves processing of signals using one or more application specific integrated circuits (ASICS) and/or special purpose processors configured for performing specific instruction sequences, e.g. directly and/or under the control of software instructions. One example of a receiver incorporating a detector, i.e. a coherent receiver, and a DSP circuit using carrier phase estimation for processing the digital outputs of the coherent receiver is described in U.S. Pat. No. 8,295,713, the teachings of which are hereby incorporated herein by reference.

With reference to both FIGS. 2 and 3, the DSP circuit 308 may process the output of the detector 302 and provide an output that reproduces data provided at the input 108-N to the transmitter 200. The de-mapper 304 receives the electrical output of the detector 302 and uses a carrier phase estimation function to reverse the mapping applied by the Gray mapper 204 and remove the parity bit applied by the parity bit encoder 202. The output of the de-mapper is a de-mapped output representative of the successive blocks of n bits of data provided at the input 108-N to the transmitter 200.

De-mapping may be performed, for example using a maximum a posteriori (MAP) detector, and may be performed iteratively in response to a priori log likelihood ratio (LLR) feedback from the output of the receiver. The de-mapper 304 in a system consistent with the present disclosure may cause correction of cycle slip using parity indicated by the parity bit applied by the parity bit encoder 202. In some embodiments, for example, the de-mapper 304 may use the parity bit to perform de-mapping in a manner that automatically causes correction of cycle slip.

In a system consistent with the present disclosure, blocks of n+1 bits (n information bits and 1 associated parity bit) provided at the output of the parity bit encoder 202 may be mapped to a plurality of QAM symbols by the Gray mapper 204 in a variety of ways. In one embodiment, for example, the Gray mapper 204 may map each block of n+1 consecutive bits at the output of the parity bit encoder 202 to an odd number of QAM symbols. For example, 12 consecutive bits (11 information bits and one associated parity bit) may be mapped to three 16-QAM symbols, 6 consecutive bits (5 information bits and one associated parity bit) may be mapped to three QPSK (4-QAM) symbols, etc. With this configuration, each block of n+1 bits associated with each group of an odd number of QAM symbols will have either an even or odd number of "1s", depending on whether the parity bit is generated from an XOR of information bits or an XNOR of information bits. At the receiver 300, the odd number of QAM symbols may be de-mapped by the de-mapper 304 using a MAP detector configured to select bits associated with a plurality of Gray mapped QAM symbols having correct parity.

Figure 4:
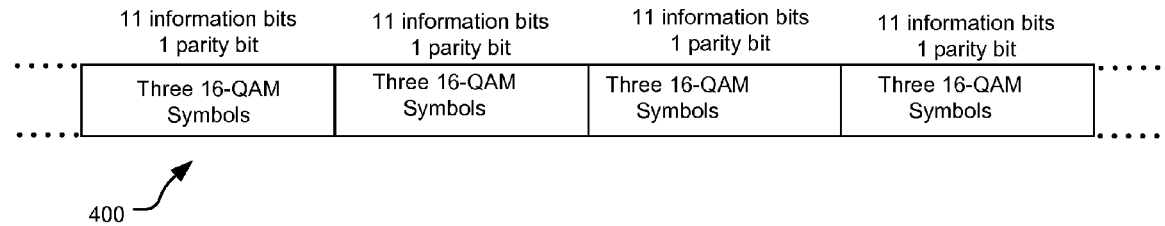
FIG. 4 diagrammatically illustrates a modulated output of an exemplary transmitter consistent with the present disclosure.
Figure 5:
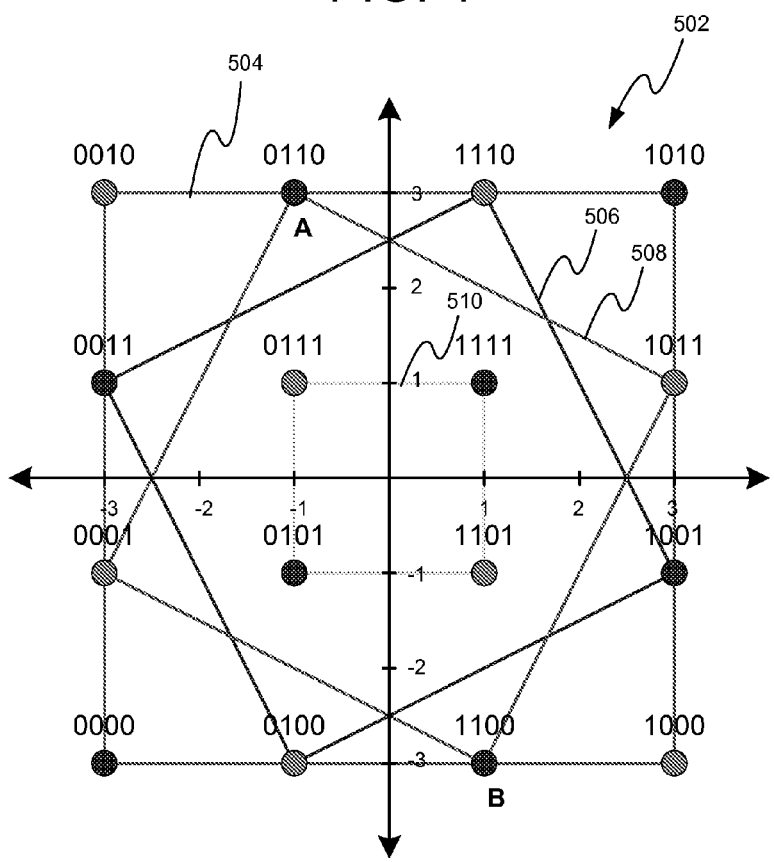
FIG. 5 is a constellation diagram of one exemplary embodiment of a 16-QAM signal with constellation points interconnected to illustrate symbols associated with 90 degree and 180 degree phase errors in a system consistent with the present disclosure.

For example, FIG. 4 diagrammatically illustrates a modulated output 400 consistent with the present disclosure wherein the parity bit encoder 202 encodes each consecutive 11 information bits (n=11) with a single odd parity bit to provide blocks of 12 bits to the Gray mapper 204. FIG. 5 is a constellation diagram 502 illustrating Gray mapping of a 16-QAM signal. In a known manner, the constellation diagram of FIG. 5 illustrates a plurality of constellation points indicating the amplitude and phase of each QAM symbol, along with the bits (code word) associated with the symbol.

In the illustrated embodiment, the Gray mapper 204 maps each consecutive block of 12 bits (11 information bits plus 1 even parity bit) to three 16-QAM symbols with each symbol mapped to a constellation point in the constellation diagram shown in FIG. 5. As shown, the resulting modulated signal includes consecutive groups of three 16-QAM symbols associated with each consecutive block of 12 bits provided at the output of the parity bit encoder 202. Since the parity bit encoder encodes each 11 information bits with an odd parity bit, the number of "1s" in bits associated with the consecutive groups of three 16-QAM symbols associated with each block of 12 bits is an odd number. Although the illustrated embodiment is described in connection with an odd parity bit imparted by the parity bit encoder 202, those of ordinary skill in the art will recognize that the parity bit encoder could alternatively encode each n information bits with an even parity bit.

At the receiver 300, the de-mapper 304 may detect and correct for cycle slip by using the fact that in Gray mapped QAM the parity associated with the mapped bits changes after every 90 degree phase rotation. This characteristic is illustrated in FIG. 5 by the squares 504, 506, 508, 510 interconnecting the constellation points. The corner of each square is positioned on a constellation point that is 90 degrees from the constellation points on the adjacent corners. For any constellation point, the constellation points that are ±90 degees therefrom have different parity. For example the 16-QAM symbol associated with bits (1 1 1 0) will change to the 16-QAM symbol associated with bits (0 0 1 1) or bits (1 0 0 1) after 90 degree phase rotation.

This rule is true for any $M^2$-QAM with Gray mapping, where M is the number of bits encoded by a symbol. In particular, for an $M^2$QAM symbol x+yi is generated by mapping $\log_2$ (M) binary bits into M-pulse amplitude modulation (PAM) in both the real and imaginary parts independently. With x and y as real numbers and Gray mapping, the PAM signal y has a property that, Parity(y)≠Parity(−y)

This is because with Gray mapping the two nearest symbols with opposite sign have only one bit difference so that the parity of these two symbols is different. The parity of QAM symbols are Parity(x+yi)=Parity(x)XOR Parity(y)

Parity(x−yi)=Parity(x)XOR Parity(−y)

Therefore,

Parity(x+yi)≠Parity(x−yi)

On the other hand, exchanging real and imaginary part of the $M^2$-QAM symbol does not change the parity Parity(x−yi)=Parity(−y+xi)

Therefore, π/2 phase rotation of symbol $(x+yi)e^{j\pi/2}$=−y+xi changes the parity.

Parity(x+yi)≠Parity(−y+xi)

Since the parity of the bits associated with Gray mapped QAM symbols changes with every 90 degree phase rotation, mapping blocks of n+1 bits (n information bits and 1 associated parity bit) to an odd number of QAM symbols i.e. 1 symbol, 3 symbols, 5 symbols, etc., can be used to detect and correct 90 degree phase rotation, i.e. cycle slip.

For example, in an embodiment wherein 12 bits are mapped to three 16-QAM symbols, at the de-mapper 304 the carrier phase for a current symbol m, i.e. ϕ(m), may be determined by a phase update rule given by:

ϕ(m)=ϕ(m−1)+μ$\Im_m$[z(m)e*(m)]

where μ is the step size parameter, $\Im_m(x)$ is the imaginary part (x), and e(m) is the error signal given by $$e(m)=z(m)-a(m)$$

where $z(m)=x(m)\exp(-j\phi(m))$ is the equalized output with phase error correction and a(m) is the estimation of z(m) by a decision device, for example, the MAP decoder.

The MAP decoder of the de-mapper 304 may determine the set of three 16-QAM symbols [a(m−1), a(m), a(m+1)] having the minimum Euclidean distance from the filtered (detected) signal [z(m−1), z(m), z(m+1)] with the constraint that the total number of "1s" in the bits associated with the symbols is equal to an odd or even number depending on the parity applied by the parity bit encoder 202. Since the error signal e(m) is driven by the MAP decoder with correct parity, the error signal will be large at 90 degree (π/2) phase error. In other words, the solution of the adaptive equalizer for phase tracking in the de-mapper 304 can never converge to 90 degree phase error, thereby preventing cycle slip into the neighboring quadrant.

Although 90 degree phase error can be detected and corrected using a configuration consistent with the present disclosure, such a system still has a phase ambiguity associated with a π phase because the parity of the mapped bits in Gray mapped QAM does not change after a 180 degree (π) rotation. For example, with a 180 degree phase rotation the 16-QAM symbol in FIG. 5 associated with bits (0 1 1 0) (labeled A) is changed to the 16-QAM symbol associated with bits (1 1 0 0) (labeled B) and the parity associated with both symbols is the same.

Figure 6:
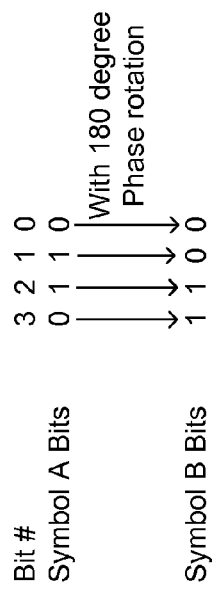
FIG. 6 diagrammatically illustrates bit changes in odd bits upon occurrence of a 180 degree phase error in a system consistent with the present disclosure.

However, even though the parity of the symbols is unchanged with a 180 phase rotation, if the bits are numbered in the conventional manner from right to left beginning with zero, the odd bits in the symbol always change after a 180 degree phase rotation and the even bits do not change. FIG. 6, for example, diagrammatically illustrates the bits associated with the 16-QAM symbol labeled A in FIG. 5 and the bits associated with the 16-QAM symbol B in FIG. 5, which is at a 180 degree phase rotation from symbol A. As shown, the even numbered bits associated with symbol A are unchanged with a 180 degree phase rotation to the bits associated with symbol B, but the odd numbered bits associated with symbol A change with the same 180 degree phase rotation to the bits associated with symbol B.

A configuration consistent with the present disclosure may use this characteristic to detect cycle slip into 180 degree phase error. In general, even bits and odd bits associated with each symbol may be encoded using independent FEC encoders. In the presence of 180 degree phase error, the FEC decoders decoding the even bits will operate with minimal errors, but the FEC decoder dealing with odd bits will have synchronization loss (a high error rate) because the odd bits change with 180 degree phase error. The errors in decoding thus allow detection of the 180 degree phase error. Detection of the errors may cause correction of the cycle slip. For example, once the 180 degree cycle slip is detected, it may be corrected by inverting the bit value of the odd bits for the whole code word.

Figure 7:
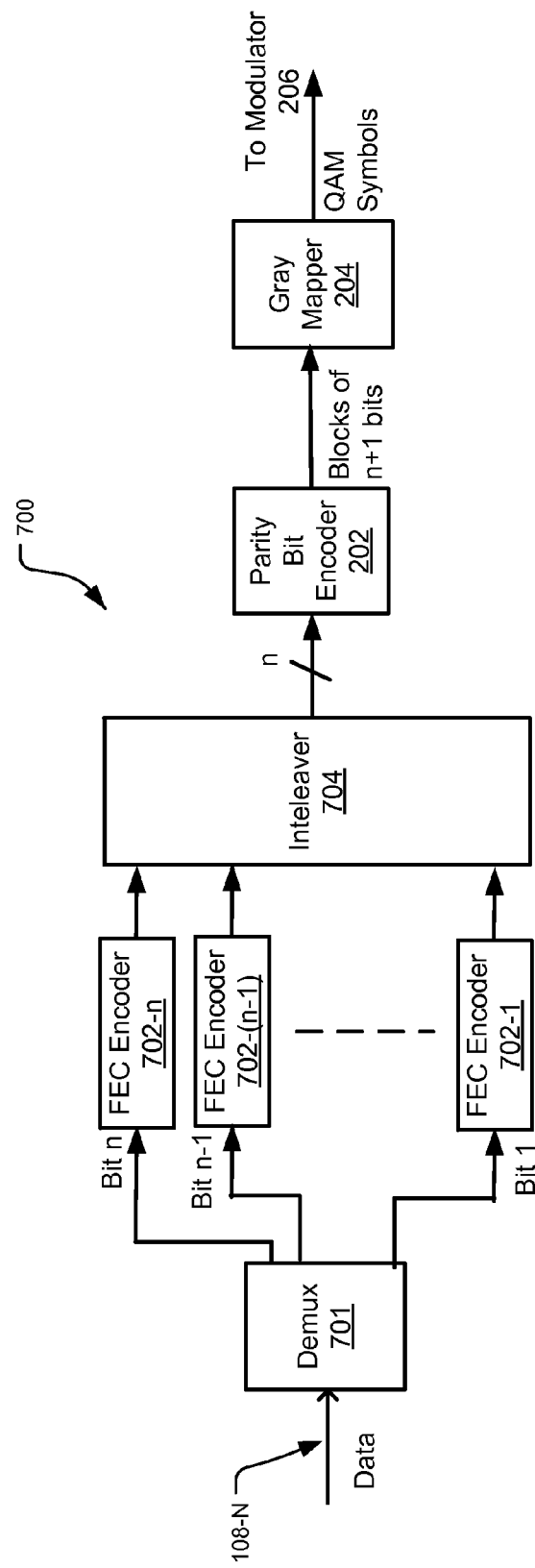
FIG. 7 is a block diagram of another exemplary embodiment of a transmitter consistent with the present disclosure.

FIG. 7 is a simplified block diagram of an exemplary transmitter 700 consistent with the present disclosure configured to detect 180 degree phase error. The illustrated exemplary embodiment 700 includes a demultiplexer 701, a plurality of FEC encoders 702-n, 702-(n−1) . . . 702-1, an interleaver 704, a parity bit encoder 202, and a Gray mapper 204 for driving a modulator 206 as described in connection with FIG. 2.

The demultiplexer 701 may take a known configuration for receiving a serial input data stream on path 108-N and demultiplexing the input data stream into n separate parallel demultiplexed data streams, i.e. every $n^{th}$ bit is separated by the demultiplexer 701 onto an associated output path. Each of the n data streams are coupled to an associated one of the FEC encoders 702-n, 702-(n−1) . . . 702-1. The FEC encoders 702-n, 702-(n−1) . . . 702-1 may each be configured to encode the data stream received thereby with an associated FEC code to provide an associated FEC encoded output.

Numerous FEC codes are known, each with different properties related to how the codes are generated and consequently how they perform. Examples of known error correcting codes include the linear and cyclic Hamming codes, the cyclic Bose-Chaudhuri-Hocquenghem (BCH) codes, the convolutional (Viterbi) codes, the cyclic Golay and Fire codes, Turbo convolutional and product codes (TCC, TPC), and low density parity check codes (LDPC). A LDPC code is a particularly useful code for the FEC encoders 702-n, 702-(n−1) . . . 702-1 due to its low associated overhead. Hardware and software configurations for implementing various error correcting codes in the FEC encoders 702-n, 702-(n−1) . . . 702-1 and corresponding decoders 802-n, 802-(n−1) . . . 802-1 (FIG. 8) are known to those of ordinary skill in the art.

The encoded output of each of the FEC encoders 702-n, 702-(n−1) . . . 702-1 is coupled to the interleaver 704. A variety of interleaver configurations are known. In the illustrated embodiment, the interleaver 704 receives n output code words from the FEC encoders 702-n, 702-(n−1) . . . 702-l and provides a parallel interleaved output of n bits to the parity bit encoder 202.

As described above, the parity bit encoder 202 may be configured to encode each block of n bits with an associated parity bit. The output of the parity bit encoder 202 includes successive blocks of n+1 bits, i.e. n information bits plus a parity bit. The encoded output of the parity bit encoder 202 is coupled to the Gray mapper 204. The Gray mapper 204 is configured map each block of n+1 bits to an associated plurality of QAM symbols, e.g. an odd number of QAM symbols. The plurality of QAM symbols associated with each block of n+1 bits are provided to the modulator 206 for modulating the symbols onto an optical carrier wavelength $\lambda_N$ of a continuous-wave laser 208.

Figure 8:
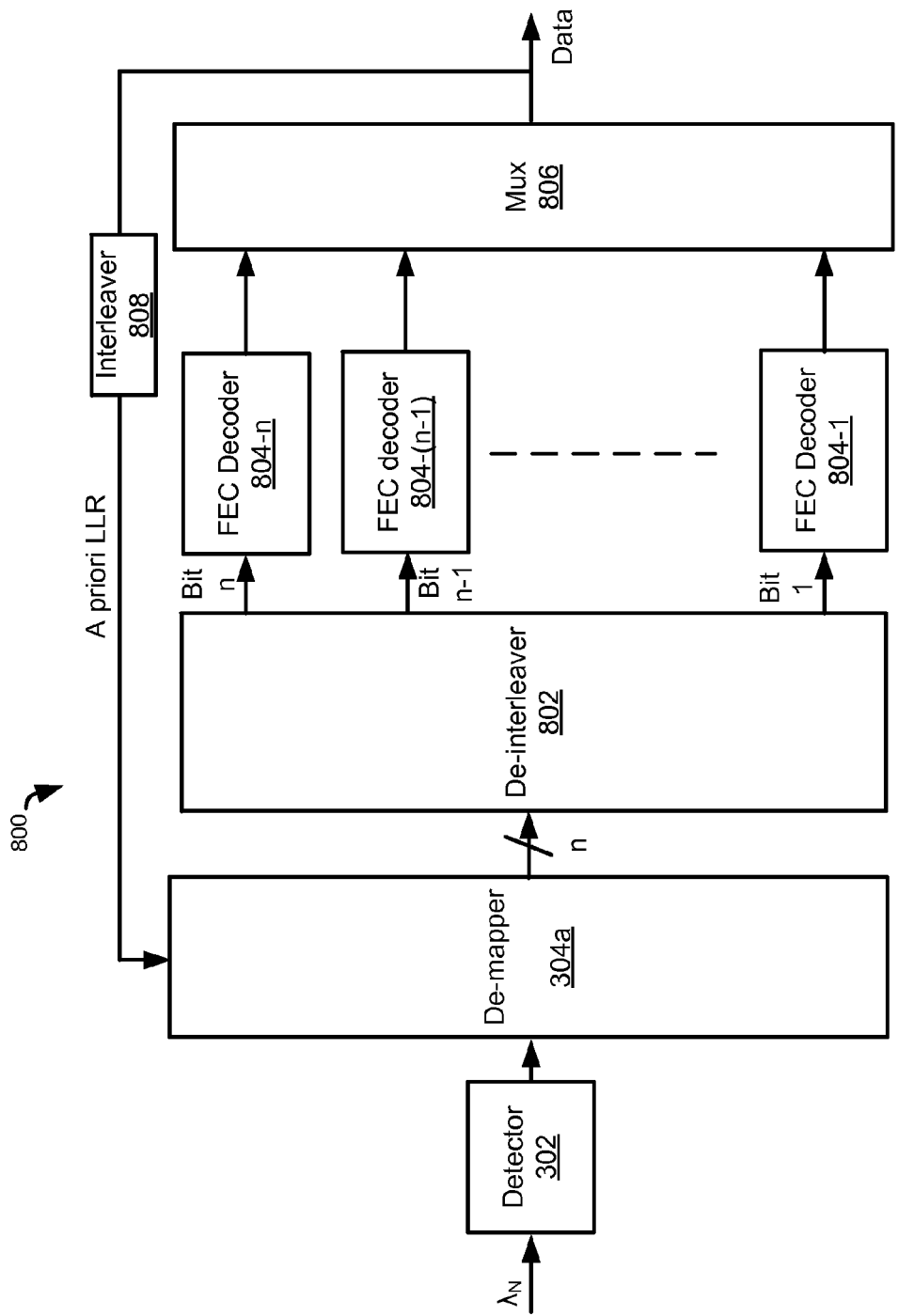
FIG. 8 is a block diagram of another exemplary embodiment of a receiver consistent with the present disclosure.

FIG. 8 is a simplified block diagram of one exemplary receiver 800 consistent with the present disclosure for receiving a signal modulated using the transmitter 700 shown in FIG. 7. The illustrated exemplary embodiment 800 includes a detector 302, a de-mapper 304a, a de-interleaver 802, a plurality of FEC decoders 804-n, 804-(n−1), 804-1, a multiplexer 806, and an interleaver 808.

As described above, the detector 302 is configured to receive the optical signal modulated on the carrier wavelength $\lambda_N$ and to convert the optical signal into an electrical signal. The de-mapper 304a receives the output of the detector 302 and reverses the mapping of data to the modulation format imparted by the Gray mapper 204 at the transmitter and removes the parity bit applied by the parity bit encoder, e.g. using a MAP decoder as described above. As shown, de-mapping may be performed iteratively in response to a priori LLR feedback from the output of the receiver, i.e. the output of the multiplexer 806 in the illustrated embodiment. The de-mapper 304a provides a de-mapper output including blocks of n bits, reproducing the output of the interleaver 704 in the transmitter 700.

The de-mapper output of the de-mapper 304a is coupled to the de-interleaver 802 which reverses the bit-interleaving performed by the associated interleaver 704 in the transmitter 700 and provides n associated de-interleaved outputs to the FEC decoders 804-n, 804-(n−1), 804-1. The FEC decoders 804-*n*, 804-(*n*−1), 804-1 may each be configured to decode the data stream received thereby using the FEC code applied at the transmitter 700 to provide associated FEC decoded outputs. The n FEC decoded outputs of each of the FEC decoders 804-*n*, 804-(*n*−1), 804-1 are coupled to a known multiplexer 806. The multiplexer 806 multiplexes outputs of the FEC code decoders 804-*n*, 804-(*n*−1), 804-1 to produce a serial digital data output that reproduces the data on path 118-N at the transmitter 700.

The data output of the multiplexer 806 is fed back to the de-mapper 304*a* through the interleaver 808 to provide a priori LLR information used by the de-mapper 304*a* in decoding the input thereto. The interleaver 808 essentially reverses the de-interleaving performed by the de-interleaver 802.

In the presence of 180 degree phase error, ones of the FEC decoders 804-*n*, 804-(*n*−1), 804-1 decoding the even bits will operate with minimal errors, but ones of the FEC decoders 804-*n*, 804-(*n*−1), 804-1 dealing with odd bits will have synchronization loss (a high error rate) because the odd bits change with 180 degree phase error. Errors reported by ones of the FEC decoders 804-*n*, 804-(*n*−1), 804-1 dealing with the odd bits may be communicated to the de-mapper 304*a* to indicate 180 degree phase error. In response to the errors reported by the FEC decoders dealing with the odd bits, the de-mapper 304 may invert the bit value of the odd bits for each code word to correct the 180 degree phase error.

Figure 9:
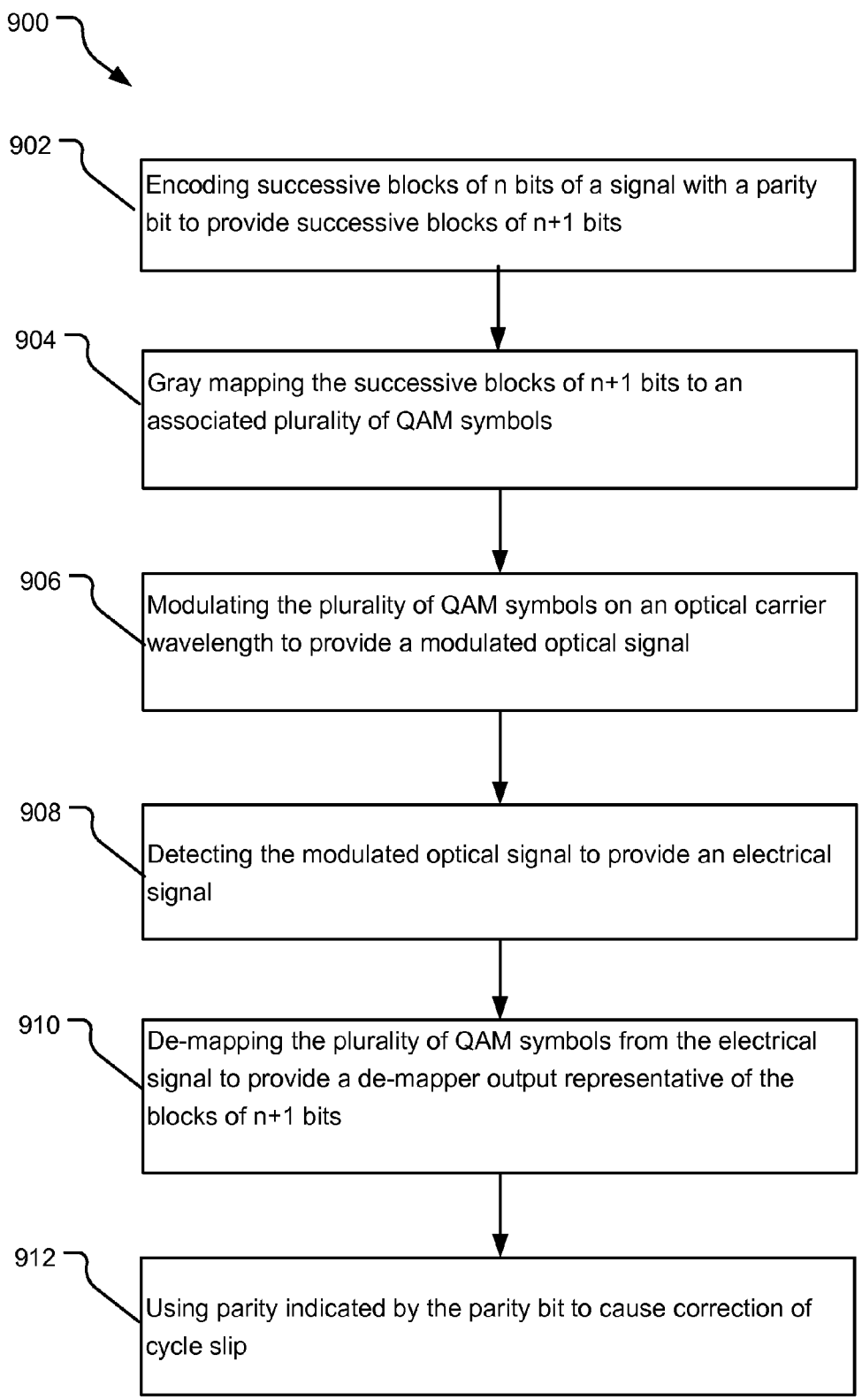
FIG. 9 is flow chart illustrating one example of a method consistent with the present disclosure.

FIG. 9 is a flow chart illustrating a method 900 consistent with the present disclosure. Operation 902 includes encoding successive blocks of n bits of a signal with a parity bit to provide successive blocks of n+1 bits. The successive blocks of n+1 bits are Gray mapped 904 to an associated plurality of QAM symbols which are modulated 906 on an optical carrier wavelength to provide a modulated optical signal. The modulated optical signal is detected 908 to provide an electrical signal, and the plurality of QAM symbols are de-mapped 910 from the electrical signal to provide a de-mapper output representative of the blocks of n+1 bits. The parity indicated by the parity bit is used 912 to cause correction of cycle slip.

While FIG. 9 illustrates various operations according to an embodiment, it is to be understood that not all of the operations depicted in FIG. 9 are necessary for other embodiments. Indeed, it is fully contemplated herein that in other embodiments of the present disclosure, the operations depicted in FIG. 9, and/or other operations described herein, may be combined in a manner not specifically shown in any of the drawings, but still fully consistent with the present disclosure. Thus, claims directed to features and/or operations that are not exactly shown in one drawing are deemed within the scope and content of the present disclosure.

Advantageously, therefore, a system consistent with the present disclosure may be configured to detect and correct phase error, i.e. cycle slip, to 90 and/or 180 degrees. The system applies a parity bit to blocks of n bits to produce blocks of n+1 bits. The blocks of n+1 bits are Gray mapped to a plurality of QAM symbols. Cycle slip to 90 degrees may be detected and corrected using parity indicated by the parity bit applied by the parity bit encoder. Cycle slip to 180 degrees may be detected and corrected by applying an FEC code independently to even and odd bits in the QAM symbol code words. Errors in detecting the odd bits in the code words at the receiver may indicate cycle slip to 180 degrees which may be corrected by inverting the value of the odd bits in the code words.

According to one aspect of the disclosure there is provided a system including a parity bit encoder configured to encode successive blocks of n bits with a parity bit to provide successive blocks of n+1 bits; a Gray mapper coupled to the parity bit encoder and configured to map each one of the blocks of n+1 bits to an associated plurality of quadrature amplitude modulated (QAM) symbols; a modulator coupled to the Gray mapper and configured to modulate an optical signal in response to an output of the Gray mapper to provide a modulated optical signal including the associated plurality of QAM symbols; a detector for receiving the modulated optical signal and providing an electrical signal representative of the optical signal; and a de-mapper configured to provide a de-mapper output representative of the blocks of n bits in response to the electrical signal, the de-mapper being further configured to cause correction of cycle slip using parity indicated by the parity bit.

According to another aspect of the disclosure, there is provided an optical signal receiver including a detector for receiving a modulated optical signal representing blocks of n+1 bits including n information bits and a parity bit mapped to an associated plurality of QAM signals and for providing an electrical signal representative of the optical signal; and a de-mapper configured to provide a de-mapper output representative of the blocks of n bits in response to the electrical signal, the de-mapper detector being further configured to cause correction of cycle slip using parity indicated by the parity bit.

According to another aspect of the disclosure there is provided a method including encoding successive blocks of n bits of a signal with a parity bit to provide successive blocks of n+1 bits; Gray mapping the successive blocks of n+1 bits to an associated plurality of QAM symbols; modulating the plurality of QAM symbols on an optical carrier wavelength to provide a modulated optical signal; detecting the modulated optical signal to provide an electrical signal; de-mapping the plurality of QAM symbols from the electrical signal to provide a de-mapper output representative of the blocks of n bits; and using parity indicated by the parity bit to cause correction of cycle slip.

Embodiments of the methods described herein may be implemented using a processor and/or other programmable device. To that end, the methods described herein may be implemented on a tangible, computer readable storage medium having instructions stored thereon that when executed by one or more processors perform the methods. Thus, for example, the transmitter and/or receiver may include a storage medium (not shown) to store instructions (in, for example, firmware or software) to perform the operations described herein. The storage medium may include any type of tangible medium, for example, any type of disk including floppy disks, optical disks, compact disk read-only memories (CD-ROMs), compact disk re-writables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of media suitable for storing electronic instructions.

It will be appreciated by those skilled in the art that any block diagrams herein represent conceptual views of illustrative circuitry embodying the principles of the disclosure. Similarly, it will be appreciated that any flow charts, flow diagrams, state transition diagrams, pseudocode, and the like represent various processes which may be substantially represented in computer readable medium and so executed by a computer or processor, whether or not such computer or processor is explicitly shown. Software modules, or simply modules which are implied to be software, may be represented herein as any combination of flowchart elements or other elements indicating performance of process steps and/or textual description. Such modules may be executed by hardware that is expressly or implicitly shown.

The functions of the various elements shown in the figures, including any functional blocks, may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read-only memory (ROM) for storing software, random access memory (RAM), and non-volatile storage. Other hardware, conventional and/or custom, may also be included.

As used in any embodiment herein, "circuitry" may comprise, for example, singly or in any combination, hardwired circuitry, programmable circuitry, state machine circuitry, and/or firmware that stores instructions executed by programmable circuitry. In at least one embodiment, the transmitter and receiver may comprise one or more integrated circuits. An "integrated circuit" may be a digital, analog or mixed-signal semiconductor device and/or microelectronic device, such as, for example, but not limited to, a semiconductor integrated circuit chip.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A system comprising:
    a parity bit encoder configured to encode successive blocks of n bits with a parity bit to provide successive blocks of n+1 bits;
    a Gray mapper coupled to said parity bit encoder and configured to map each one of said blocks of n+1 bits to an associated plurality of quadrature amplitude modulated (QAM) symbols;
    a modulator coupled to said Gray mapper and configured to modulate an optical signal in response to an output of said Gray mapper to provide a modulated optical signal comprising said associated plurality of QAM symbols;
    a detector for receiving said modulated optical signal and providing an electrical signal representative of said optical signal; and
    a de-mapper configured to provide a de-mapper output representative of said blocks of n bits in response to said electrical signal, said de-mapper being further configured to cause correction of cycle slip using parity indicated by said parity bit.

2. A system according to claim 1, wherein said plurality of QAM symbols comprises an odd number of QAM symbols.

3. A system according to claim 1, wherein said de-mapper is configured to provide said de-mapper output by selecting bits associated with a plurality of Gray mapped QAM symbols having a parity corresponding to said parity indicated by said parity bit and a minimum Euclidean distance from a received plurality of QAM symbols detected from said electrical signal.

4. A system according to claim 1, said system further comprising
    a demultiplexer configured to receive a serial input data stream and demultiplex said serial input data stream into a plurality of demultipexed data streams;
    a plurality of forward error correction (FEC) encoders, each of said FEC encoders being configured to encode an associated one of said demultiplexed data streams using a FEC code and provide an associated FEC encoded output; and
    an interleaver coupled said plurality of FEC encoders and configured to provide an interleaved output comprising said successive blocks of n bits to said parity bit encoder.

5. A system according to claim 1, said system further comprising
    a de-interleaver coupled to said de-mapper and configured to provide a plurality of de-interleaved outputs in response to said de-mapper output; and
    a plurality of FEC decoders, each of said FEC decoders being configured to receive an associated one of said de-interleaved outputs and provide an associated FEC decoded output signal.

6. A system according to claim 5, said system being configured to cause correction of 180 degree cycle slip in said carrier phase estimation in response to errors reported by ones of said FEC decoders associated with odd bits of said de-mapper output.

7. An optical signal receiver comprising:
    a detector for receiving a modulated optical signal representing blocks of n+1 bits comprising n information bits and a parity bit mapped to an associated plurality of QAM signals and for providing an electrical signal representative of said optical signal; and
    a de-mapper configured to provide a de-mapper output representative of said blocks of n bits in response to said electrical signal, said de-mapper being further configured to cause correction of cycle slip using parity indicated by said parity bit.

8. A receiver according to claim 7, wherein said plurality of QAM symbols comprises an odd number of QAM symbols.

9. A receiver according to claim 7, wherein said de-mapper is configured to provide said de-mapper output by selecting bits associated with a plurality of Gray mapped QAM symbols having a parity corresponding to said parity indicated by said parity bit and a minimum Euclidean distance from a received plurality of QAM symbols detected from said electrical signal.

10. A receiver according to claim 7, said receiver further comprising
    a de-interleaver coupled to said de-mapper and configured to provide a plurality of de-interleaved outputs in response to said de-mapper output; and
    a plurality of FEC decoders, each of said FEC decoders being configured to receive an associated one of said de-interleaved outputs and provide an associated FEC decoded output signal.

11. A receiver according to claim 10, said receiver being configured to cause correction of 180 degree cycle slip in said carrier phase estimation in response to errors reported by ones of said FEC decoders associated with odd bits of said de-mapper output.

12. A method comprising:
    encoding successive blocks of n bits of a signal with a parity bit to provide successive blocks of n+1 bits;

Gray mapping said successive blocks of n+1 bits to an associated plurality of QAM symbols;

modulating said plurality of QAM symbols on an optical carrier wavelength to provide a modulated optical signal;

detecting said modulated optical signal to provide an electrical signal;

de-mapping said plurality of QAM symbols from said electrical signal to provide a de-mapper output representative of said blocks of n bits; and using parity indicated by said parity bit to cause correction of cycle slip.

13. A method according to claim 12, wherein said plurality of QAM symbols comprises an odd number of QAM symbols.

14. A method according to claim 12, wherein said de-mapping comprises selecting bits associated with a plurality of Gray mapped QAM symbols having a parity corresponding to said parity indicated by said parity bit and a minimum Euclidean distance from a received plurality of QAM symbols detected from said electrical signal.

15. A method according to claim 12, said method further comprising demultiplexing an input signal to provide a plurality of demultiplexed data streams;

encoding each of said plurality of demultiplexed data streams using an forward error correction (FEC) code to provide a plurality of FEC encoded outputs; and interleaving said FEC encoded outputs to provide said successive blocks of n bits.

16. A method according to claim 15, said method further comprising de-interleaving said de-mapper output to provide a plurality of de-interleaved outputs; and decoding said de-interleaved outputs using said FEC code to provide a plurality of FEC decoded outputs.

17. A method according to claim 16, said method further comprising identifying 180 degree cycle slip in said carrier phase estimation in response to ones of said FEC code decoded outputs corresponding to odd numbered bits of said de-mapper output.

* * * * *